US010495670B2

(12) United States Patent
Huber et al.

(10) Patent No.: US 10,495,670 B2
(45) Date of Patent: Dec. 3, 2019

(54) MEASURING DEVICE AND METHOD WITH AUTOMATED TRIGGER FUNCTION (71) Applicant: Rohde & Schwarz GmbH & Co. KG, Munich (DE)

(72) Inventors: Johann Huber, Markt Schwaben (DE); Markus Freidhof, Kirchseeon (DE); Nico Toender, Haar (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/378,803

(22) Filed: Dec. 14, 2016

(65) Prior Publication Data
US 2017/0168093 A1  Jun. 15, 2017

(30) Foreign Application Priority Data

Dec. 14, 2015 (EP) .................... 15199743

(51) Int. Cl.
G01R 13/02 (2006.01)
G01R 13/34 (2006.01)
G01R 13/32 (2006.01)

(52) U.S. Cl.
CPC ......... *G01R 13/0254* (2013.01); *G01R 13/32* (2013.01); *G01R 13/34* (2013.01); *G01R 13/345* (2013.01)

(58) Field of Classification Search
CPC .... G01R 13/0254; G01R 13/24; G01R 13/32; G01R 13/345
See application file for complete search history.

(56) References Cited

U.S. PATENT DOCUMENTS 5,495,168 A * 2/1996 de Vries ................. G01R 13/32
                                              324/121 R
2003/0220753 A1* 11/2003 Pickerd .............. G01R 13/0254
                                                  702/67
2013/0099817 A1  4/2013 Haigh

FOREIGN PATENT DOCUMENTS

EP  0418499  12/1996
EP  2713170   4/2014

* cited by examiner

Primary Examiner — Sujoy K Kundu
Assistant Examiner — L. Anderson
(74) Attorney, Agent, or Firm — Lee & Hayes, P.C.

(57) ABSTRACT

A measuring device comprises an interface, adapted to acquire a measuring signal, a triggering unit, adapted to determine at least one condition of the measuring signal based on an initial triggering condition, and a storage unit adapted to store data words, comprising changes of the at least one condition of the measuring signal and instances in time at which the changes of the at least one condition occur. Moreover, the measuring device comprises a parameter determination unit, adapted to determine at least one parameter from the data words and a parameter histogram unit, adapted to determine a parameter histogram of the at least one parameter.

14 Claims, 6 Drawing Sheets

MEASURING DEVICE AND METHOD WITH AUTOMATED TRIGGER FUNCTION

PRIORITY

This application claims priority of European patent application EP 15 199 743.4 filed on Dec. 14, 2015.

FIELD OF THE INVENTION

The invention relates to a measuring device, especially to an oscilloscope, which assists a user in setting an optimal trigger.

BACKGROUND OF THE INVENTION

Regular oscilloscopes often have a great diversity in available trigger functions. An expert user understands all of these trigger functions and is able to decide for an optimal trigger function depending upon the measuring signal and depending upon what he intends to measure. A novice user though is overwhelmed with the variety of available trigger functions and the parameter settings of the individual trigger function.

Document US 2013/099827 A1 shows a measuring device, which assists the user in finding a suitable trigger function. The measuring device records the entire measuring signal and performs an analysis of the entire measuring signal in order to determine which trigger conditions can be used.

The above-described approach though is disadvantageous, since it makes it necessary to record the entire measuring signal. This requires very complex measuring device hardware and requires a great computational complexity for performing the following analysis.

Accordingly, there is a need to provide a measuring device and method, which even for a novice user allows an accurate measurement of a measuring signal with optimal trigger function selection, while only requiring a low-complexity hardware setup.

SUMMARY OF THE INVENTION

According to a first aspect of the invention, a measuring device is provided. The measuring device comprises an interface, adapted to acquire a measuring signal, a triggering unit, adapted to determine at least one condition of the measuring signal based on an initial triggering condition, and a storage unit adapted to store data words, comprising changes of the at least one condition of the measuring signal and instances in time at which the changes of the at least one condition occur. Moreover, the measuring device comprises a parameter determination unit, adapted to determine at least one parameter from the data words and a parameter histogram unit, adapted to determine a parameter histogram of the at least one parameter.

By only storing the data words comprising the changes of the at least one condition and the instances in time at which the changes occur, it is possible to significantly reduce the amount of data to store and analyze. A significant reduction in the complexity of the hardware setup and in the computational complexity of the following analysis can thereby be achieved.

According to a first preferred implementation form of the first aspect, the measuring device further comprises a trigger determining unit, adapted to determine a trigger type and trigger parameters based upon the parameter histogram. It is thereby possible to determine an optimal trigger setup without requiring great hardware complexity or user knowledge.

According to a further preferred implementation form of the first aspect, the triggering unit is adapted to perform a triggering of the measuring signal based upon the trigger type and trigger parameters determined by the trigger determining unit. It is thereby possible to perform an accurate triggering of the measuring signal without require a great hardware effort or high user skill.

According to a further preferred implementation of the first aspect, the measuring device further comprises a measuring unit, adapted to measure the measuring signal based upon the triggering performed by the triggering unit. It is thereby possible to perform a complete measuring of the measuring signal without requiring a complex hardware setup or high user skill.

According to a further preferred implementation form of the first aspect, the measuring device further comprises a display device adapted to display the parameter histogram. It is thereby possible to discern, for the user, how the trigger type and parameters are selected. Alternatively, starting from this display, the user can manually select a trigger type and the according trigger parameters, in order to further study aspects of the measuring signal identified by the parameter histogram.

According to a further preferred implementation form of the first aspect, the measuring device comprises a further interface, adapted to receive a further measuring signal, which is then processed as the measuring signal is processed. Also, a plurality of interfaces corresponding to measuring channels can be implemented. It is thereby possible to measure a number of measuring signals in parallel.

According to a further preferred implementation form of the first aspect, the measuring device furthermore comprises a clock signal interface, adapted to receive a clock signal. A further increase in measuring accuracy can thereby be achieved.

According to a further preferred implementation form of the first aspect, the at least one parameter is an interval length or a cycle length, or a glitch time, or a rise time, or a fall time, or a setup and hold time. Also, other types of parameters can be used. This leads to a great flexibility regarding the selection of an optimal trigger function.

According to a further preferred implementation form of the first aspect, the parameter histogram unit is adapted to determine the parameter histogram based on a signal amplitude or based on a time condition of the measuring signal. It is thereby possible to achieve an accurate measurement without requiring a complex hardware or high user skill.

According to a further preferred implementation form of the first aspect, the measuring device comprises an amplitude histogram unit, adapted to determine an amplitude histogram of the measuring signal. It is thereby possible to determine information allowing the selection of the initial trigger condition without requiring a great hardware effort or user skill.

According to a preferred implementation form of the previous implementation form, the amplitude histogram unit is furthermore adapted to determine the initial triggering condition from the amplitude histogram. It is thereby possible to determine the initial trigger condition without any user input.

According to a preferred implementation form of the previous implementation form, the amplitude histogram unit is furthermore adapted to determine the initial triggering condition as a comparison of an amplitude of the measuring signal to at least one threshold, preferably to an upper threshold and to a lower threshold. A very simple determining of the initial trigger condition is thereby provided.

According to a second aspect of the invention, a method is provided. The method comprises acquiring a measuring signal, determining at least one condition of the measuring signal based on an initial triggering condition, storing data words, comprising changes of the at least one condition of the measuring signal, and instances in time at which the changes of the at least one condition occur, determining at least one parameter form the data words, and determining a parameter histogram of the at least one parameter. It is thereby possible to very accurately determine the foundation of performing an accurate measurement without requiring a complex hardware setup or high user skill.

According to a third preferred aspect of the invention, a computer program with program code means for performing all steps according to the second aspect, if the program is executed on a computer or digital signal processor, is provided.

According to a fourth aspect of the invention, an oscilloscope being or having a measurement device of the first aspect of the invention, is provided.

BRIEF DESCRIPTION OF THE DRAWINGS

An exemplary embodiment of the invention is now further explained with respect to the drawings by way of example only.

In the drawings.

DETAILED DESCRIPTION OF THE DRAWINGS

Figure 1:
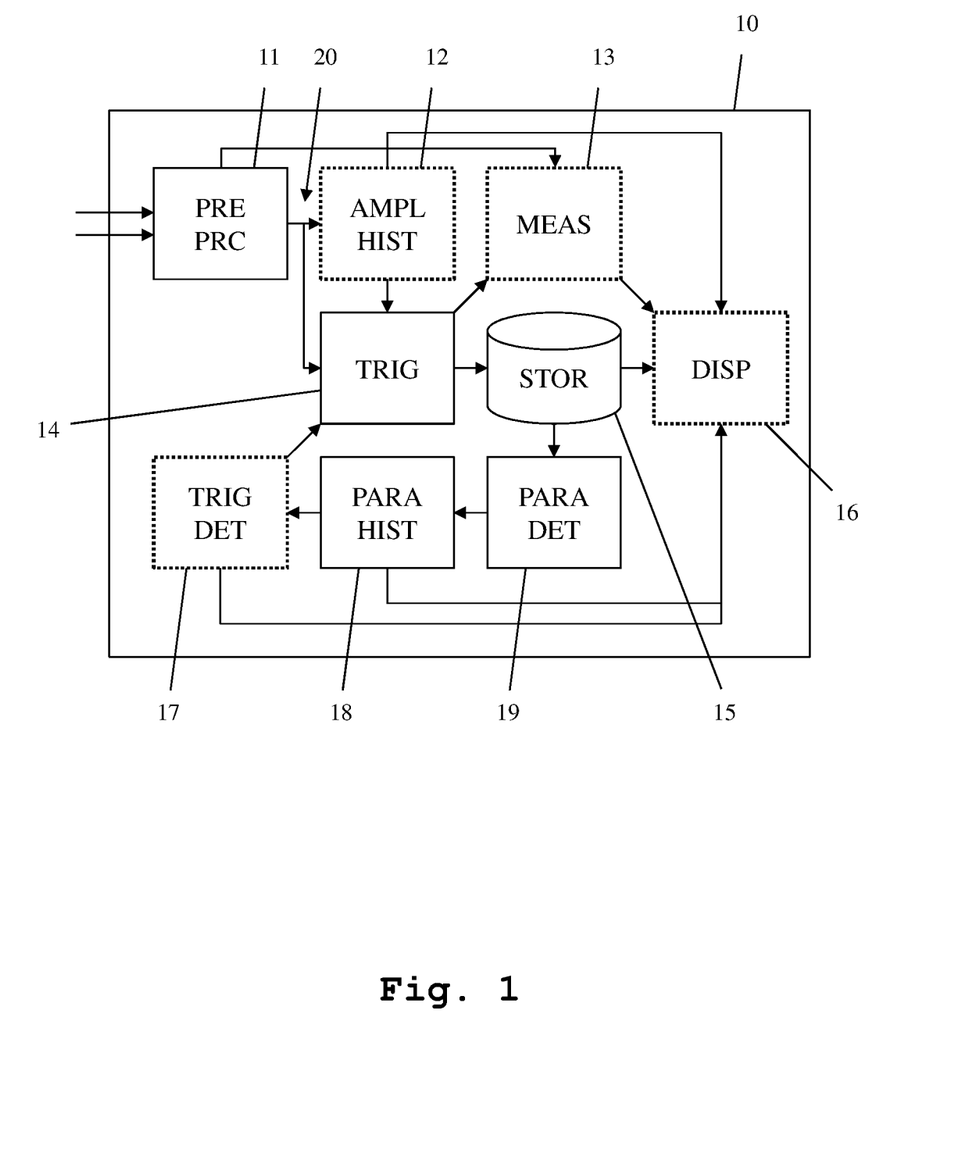
FIG. 1 shows a block diagram of an embodiment of the measuring device according to the first aspect of the invention.

At first we demonstrate the construction and function of an embodiment of the measuring device according to the first aspect of the invention along FIG. 1. Along FIGS. 2-7, further details regarding the function of the embodiment shown in FIG. 1 are given. Finally, along FIG. 8 and FIG. 9, different embodiments of the method according to the second aspect of the invention are provided. Similar entities and reference numbers and different figures have been partially omitted.

In FIG. 1, an embodiment of the measuring device 10 according to the first aspect of the invention is shown. The measuring device 10 comprises a pre-processing unit 11, an amplitude histogram unit 12, a measuring unit 13, a triggering unit 14, a storage unit 15, a display unit 16, a triggering determining unit 17, a parameter histogram unit 18 and a parameter determining unit 19.

The pre-processing unit 11 is connected to the amplitude histogram unit 12, to the measuring unit 13 and to the triggering unit 14. The amplitude histogram unit 12 is moreover connected to the triggering unit 14 and to the display unit 16. The measuring unit 13 is moreover connected to the triggering unit 14 and the display unit 16. The triggering unit 14 is furthermore connected to the triggering determining unit 17 and to the storage unit 15. The storage unit 15 is also connected to the display unit 16 and to the parameter determining unit 19. The display unit 16 is additionally connected to the triggering determining unit 17 and to the parameter histogram unit 18. The triggering determining unit 17 is moreover connected to the parameter histogram unit 18. The parameter histogram unit 18 is furthermore connected to the parameter determining unit 19. The amplitude histogram unit 12, the measuring unit 13, the display unit 16 and the triggering unit 17 are optional components.

The pre-processing unit 11 comprises one or more inputs for analog measuring signals, which correspond to the measuring channels of the measuring device 10. Additionally, the pre-processing unit 11 can comprise a clock signal input for inputting a clock signal.

The pre-processing unit 11 is adapted to perform a pre-processing of the input signals, for example a filtering and an analog-digital-conversion. The pre-processing unit 11 can be considered as interface for acquiring a measuring signal 20. In the following, the term measuring signal 20 is used as digital data stream output by the pre-processing unit 11. As explained before, the measuring device can comprise more than one measuring channel. Therefore, the pre-processing unit 11 can serve as interface not only for a single measuring signal 20 but for a plurality of measuring signals 20.

The measuring signal 20 is handed to the triggering unit 14. The triggering unit 14 determines at least one condition of the measuring signal 20 based on an initial triggering condition. For example, the triggering unit 14 compares the measuring signal 20 to an upper threshold and to a lower threshold and thereby determines as the at least one condition, when the measuring signal 20 is above the upper threshold and when the measuring signal 20 is below the lower threshold. Also, only a use of a single threshold or different conditions of the measuring signal 20 is possible. The triggering unit 14 hands on the information regarding the conditions of the measuring signal 20 to the storage unit 15, which stores data words comprising changes of the at least one condition of the measuring signal 20 and instances in time at which the changes of the at least one condition occur.

The parameter determination unit 19 determines at least one parameter from the data words stored in the storage unit 15. These parameters are for example an interval length or a cycle length or a glitch time or a rise time or a fall time or a setup and hold time. Also a number of further parameters is possible. Based upon the determined at least one parameter, the parameter histogram unit 18 determines a parameter histogram for the at least one parameter. This means that the parameter histogram unit 18 determines a separate parameter histogram for each employed parameter. Based upon these parameter histograms, a user can then very efficiently select a trigger type and the according trigger parameters in order to perform an optimal triggering of the measuring signal 20.

Alternatively, the optional trigger determining unit 17 determines the trigger type and the trigger parameters automatically based upon the at least one parameter histogram provided by the parameter histogram unit 18.

The triggering determining unit 17 is optionally adapted to suggest one or more different trigger types and parameters for measuring different aspects of the measuring signal 20. These different trigger types and parameters are then displayed on the display unit 16. Alternatively or additionally, a triggering based upon a plurality of different trigger types and parameters selected by the triggering determining unit 17 can be automatically performed. The results of the triggering and measuring based there upon are then displayed on the display unit 16. The user can then select the desired combination of trigger type and parameters from the displayed options.

For example the trigger types can be edge, glitch, width, runt, enter/exists window, stays in/out of window, time out, interval, transition, setup and hold, pattern, and state. Also, other trigger types can be used. The trigger parameters in each case are according to the selected trigger type. For example, in the case of an edge trigger, the trigger parameter is a single threshold. In case of a glitch/width trigger, the parameters also are a single threshold. In case of a runt trigger, the parameters are two thresholds. In case of an enter/exists window trigger, the trigger parameters are two thresholds. In case of a stays in/out of window trigger, the parameters are two thresholds, in case of a time out trigger, trigger parameters are a single threshold. In case of an interval trigger, the trigger parameter is a single threshold. In case of a transition trigger, the trigger parameters are two thresholds in case of a setup and hold trigger, the trigger parameters are a clock threshold and a time threshold. In case of a pattern trigger, the trigger parameters are one threshold for each measuring signal 20 and in case of a state trigger, the trigger parameters depend on the type of state trigger.

The user-selected or automatically generated trigger type and trigger parameters are then handed on to the triggering unit 14, which performs a triggering of the measuring signal 20 based upon the trigger type and the trigger parameters. The optional measuring unit 13 is then adapted to measure the measuring signal 20 based upon the performed triggering. Measuring results can then be displayed on the optional display unit 16. In addition, the display unit 16 can be used for displaying the parameter histograms provided by the parameter histogram unit 18. Based upon the displayed parameter histograms, the user can perform the trigger type and trigger parameter selection.

The initial triggering condition used by the triggering unit 14 for determining the at least one condition of the measuring signal 20 can furthermore be provided by the optional amplitude histogram unit 12. In this case, the amplitude histogram unit 12 is provided with the measuring signal 20 by the pre-processing unit 11. The amplitude histogram unit 12 then determines an amplitude histogram of the measuring signal 20 and therefrom determines the initial triggering condition. For example, the amplitude histogram unit 12 selects an upper threshold and a lower threshold of the amplitude of the measuring signal 20 within the amplitude histogram. This initial triggering condition is handed on to the triggering unit 14 for determining the at least one condition of the measuring signal 20.

Optionally, the amplitude histogram can also be displayed on the display device 16. The user can then interact with the amplitude histogram and for example set the initial trigger condition manually, for example one or more thresholds.

Figure 2:
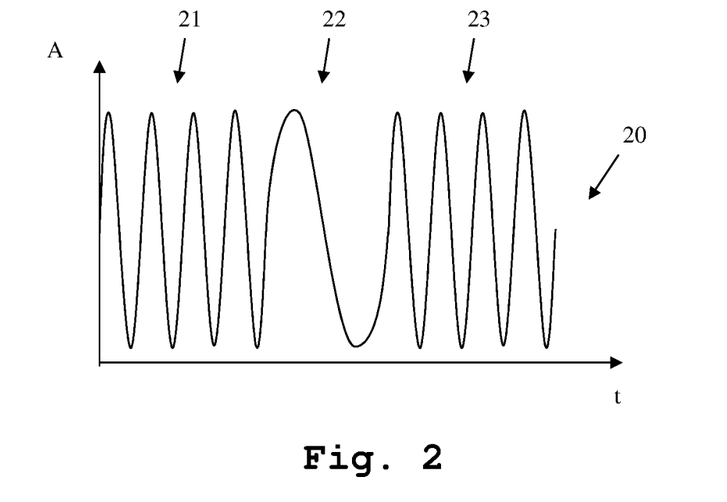
FIG. 2 shows an exemplary measuring signal.

In FIG. 2, an exemplary measuring signal 20 comprising a first section 21, a second section 22 and a third section 23 is depicted. The axis of FIG. 2 shows time, while the y-axis shows the amplitude of the measuring signal 20. Here, only a short part of the measuring signal 20 is shown. In reality, the first section 21 and the third section 23 are significantly longer than depicted here. This means that the measuring signal 20 at large is a sine-signal of a specific amplitude and frequency, as shown in the first section 21 and the third section 23. Moreover, the exemplary measuring signal 20 comprises a single erroneous section, here depicted as section 22. The error shown in this section occurs only infrequently in comparison to the frequency of the measuring signal 20. When trying to display the signal using a regular oscilloscope, it is very unlikely for an inexperienced user to actually detect the erroneous section 22, since a regular amplitude trigger would most likely display a part of the non-erroneous sections 21, 23 of the measuring signal 20. When using the present invention though, it is possible to help a user to find this anomaly in the signal 20.

Figure 3:
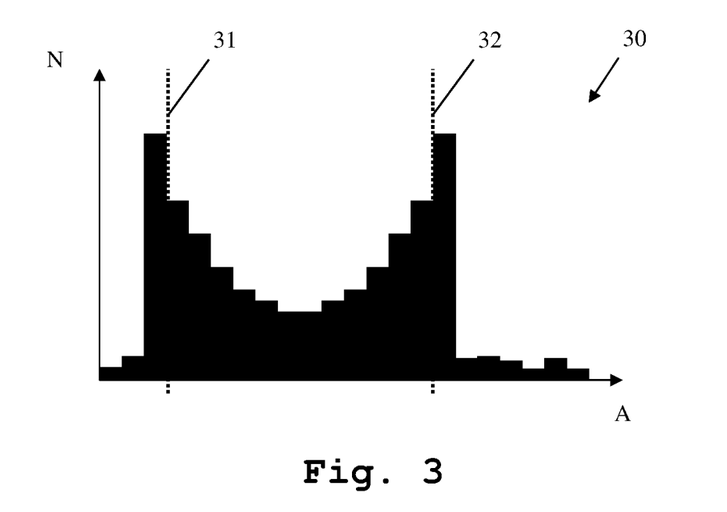
FIG. 3 shows an exemplary amplitude histogram.

In FIG. 3 an amplitude histogram 30 of the measuring signal 20 as generated by the amplitude histogram unit 12 is displayed. The x-axis of FIG. 3 shows the amplitude of the measuring signal 20, while the y-axis shows the number of occurrence of different amplitudes. Here, a quantization to a finite number of amplitude bins is performed. It can clearly be seen that the amplitude histogram 30 has an obvious left cut off value and an obvious right cut off value, beyond which only very small numbers of measuring values occur. These are due to noise within the measuring signal 20. The shape of the amplitude histogram 30 is concurrent with that of a regular sine-signal. The anomaly of the second section 22 of the measuring signal 20 does not show up within the amplitude histogram 30. Based upon the amplitude histogram 30, the amplitude histogram unit 12 is adapted to determine the initial triggering condition. In this case, the amplitude histogram unit 12 decides for using an upper threshold 32 and a lower threshold 31, which are placed inwards of the most frequent bins of the histogram. Alternatively, a user can set the initial triggering condition manually based on the amplitude histogram.

Figure 4:
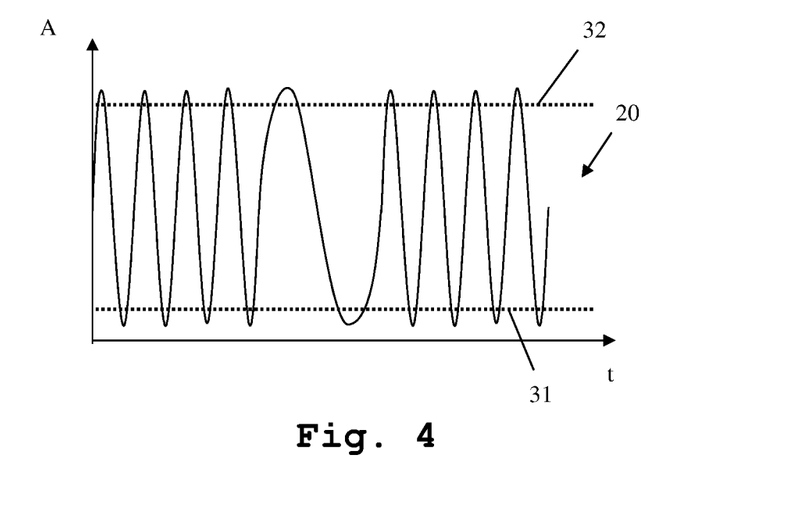
FIG. 4 shows the exemplary measuring signal of FIG. 2 and exemplary amplitude thresholds.

In FIG. 4, the lower threshold 31 and upper threshold 32 selected by the amplitude histogram unit 12 are shown in a time-diagram along with the measuring signal 20. Also here, on the x-axis, time is displayed, while on the y-axis, the amplitude of the measuring signal is shown.

Figure 5A:
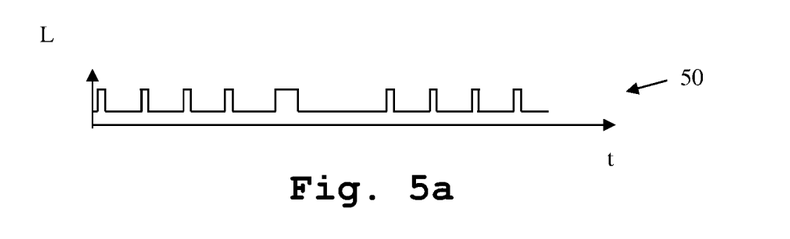
FIG. 5a shows an exemplary first comparison of the amplitude of the measuring signal of FIG. 2 with an upper threshold.
Figure 5B:
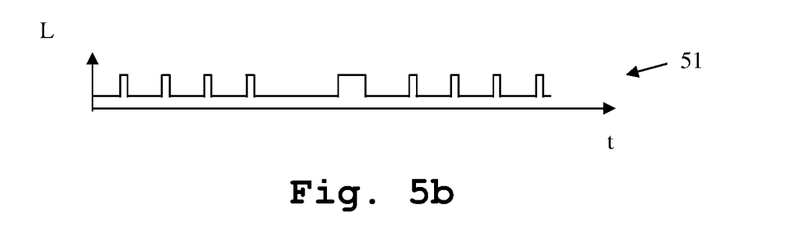
FIG. 5b shows a second comparison of the amplitude of the measuring signal of FIG. 2 with an upper threshold.

In FIG. 5*a* and FIG. 5*b*, the resulting decisions of the triggering unit 14 based upon the lower threshold 31 and upper threshold 32 are shown as signals 50, 51. Especially, FIG. 5*a* shows when the measuring signal 20 surpasses the upper threshold 32 and FIG. 5*b* shows when the measuring signal is lower than the lower threshold 31. In FIG. 5*a* and FIG. 5*b*, on the x-axis, time is displayed. On the y-axis, two different logical states HIGH and LOW are shown. A HIGH value indicates a positive decision, a LOW value indicates a negative decision. Based upon this information, the storage unit 15 then stores data words comprising the changes in the condition of the measuring signal 20 and the times of occurrence. This means that the instances of signal level change of FIG. 5*a* and FIG. 5*b* are stored.

Figure 6:
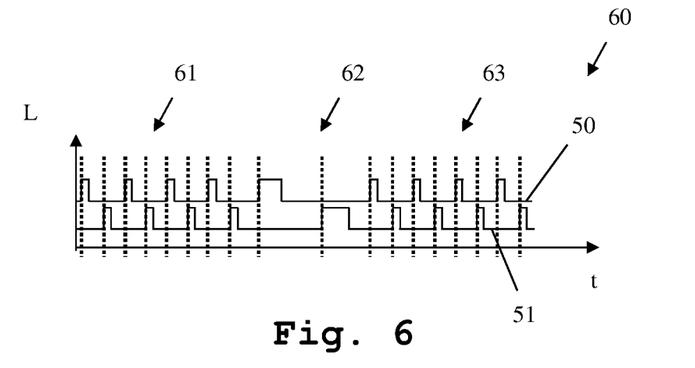
FIG. 6 shows an interval between the measuring signal passing a lower threshold and passing an upper threshold as parameter determined from data words.

In FIG. 6, the signals 50, 51 of FIG. 5*a* and FIG. 5*b* are displayed together. The axes are identical to the axes of FIG. 5*a* and FIG. 5*b*. The only difference is that the signals 50, 51 are displayed shifted in the y-direction for reasons of intelligibility.

Moreover, in FIG. 6, the determining of a parameter of the data words is shown. Here, the rising edges of the signals 50 and 51 are marked. These rising edges correspond to the times when the measuring signal passes the upper threshold and lower threshold from between the thresholds. The parameter selected here therefore is the interval length between the measuring signal 20 surpassing the upper threshold and the lower threshold form within the thresholds. Alternative parameters can be a cycle length, or a glitch time, or a rise time, or a fall time, or a setup and hold time. Also different parameters from the parameters described here can be used.

The choice of the used parameter can be automatically made by the parameter determining unit 19. Alternatively, the parameter to be used can be chosen by the user. In this case, possible parameters can be displayed on the display device 16. The user can then choose his desired parameter to use for further processing.

Figure 7:
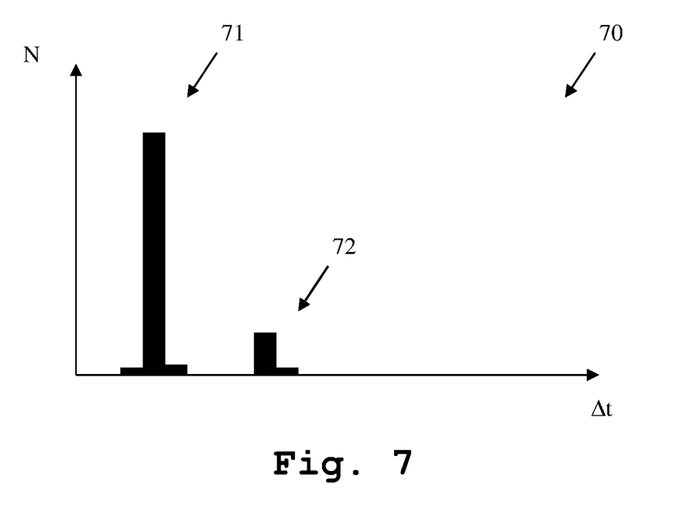
FIG. 7 shows a parameter histogram of the parameter shown in FIG. 6.

In FIG. 7, a parameter histogram 70 based upon the time interval parameter explained along FIG. 6, as provided by the parameter histogram unit 18, is shown. Here, a first peak 70 corresponding to the time interval as present in sections 61 and 63 of graph 60 is shown. A second peak 72 corresponds to the time interval of section 62 of the graph 60 of FIG. 6.

The parameter histogram 70 is optionally then displayed to the user by use of the display unit 16. The user can then select one of the peaks 71, 72 in order to perform a triggering on the respective section of the measuring signal. If he selects peak 71, the triggering unit 14 performs a triggering on sections 21, 23 of the measuring signals 20. If he selects peak 72, the triggering unit 14 performs a triggering on section 22 of the measuring signal 20.

Alternatively, the triggering determining unit 17 can automatically select the trigger type and the trigger parameters based upon the parameter histogram 70. Also, as explained earlier, the triggering determining unit 17 can select more than one trigger type and according parameters and offer a user a selection between these. This choice can for example be displayed on the display device 16.

Figure 8:
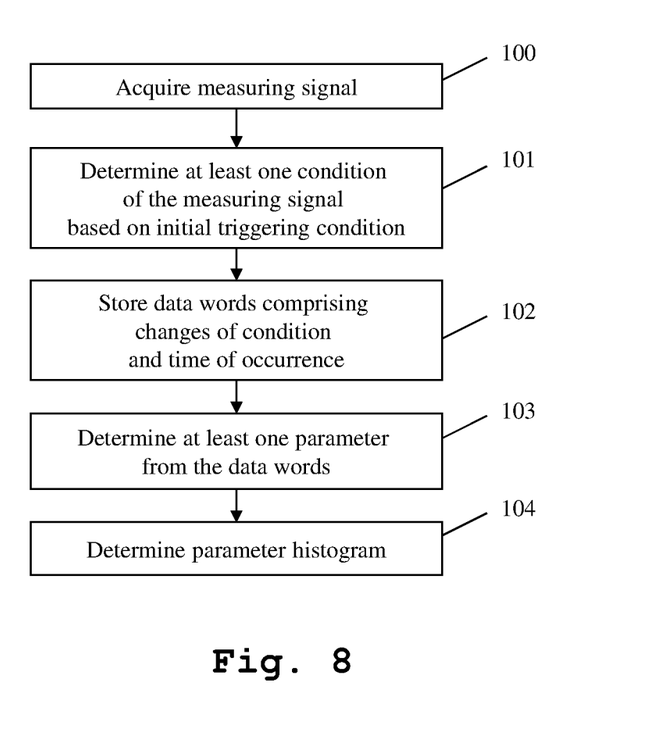
FIG. 8 shows a flow chart of a first embodiment of the second aspect of the invention.

In FIG. 8, a first embodiment of the inventive measuring method is shown. In a first step 100, a measuring signal is acquired. In a second step 101, at least one condition of the measuring signal is determined based on an initial triggering condition. In a third step 102, data words comprising changes of the condition and times of occurrence of the changes are stored. In a fourth step 103, at least one parameter is determined from the data words. In a fifth step 104, a parameter histogram is determined based upon the at least one determined parameter.

Figure 9:
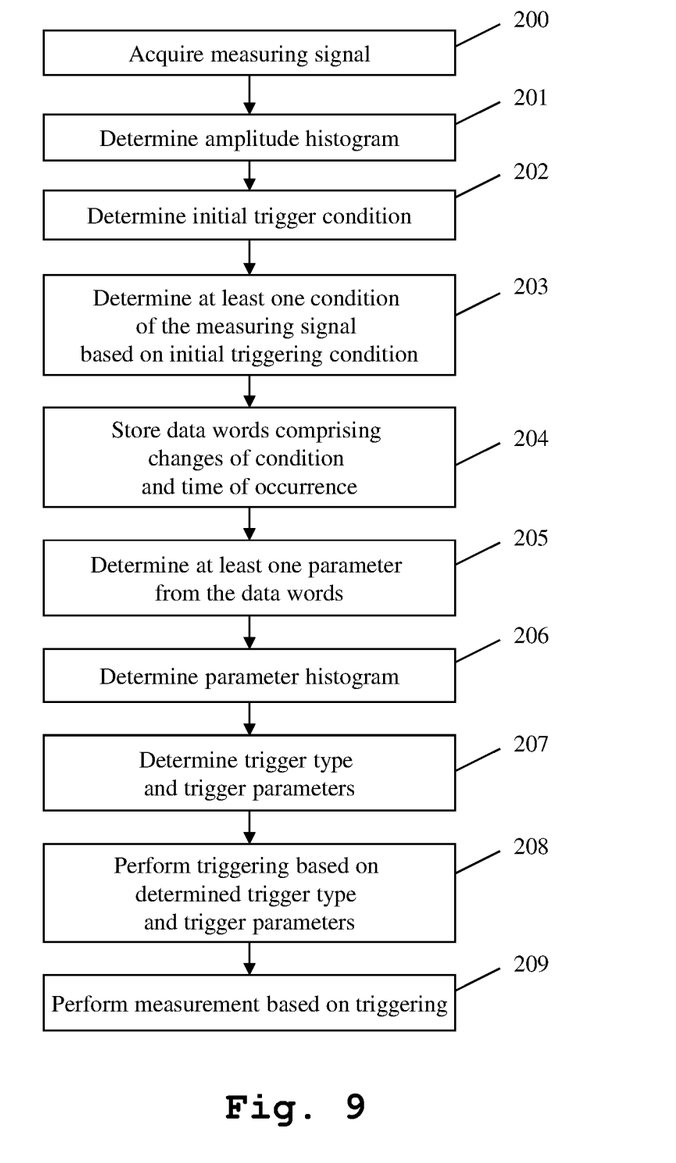
FIG. 9 shows a flow chart of a second embodiment of the second aspect of the invention.

In FIG. 9, a more elaborate embodiment of the measuring method according to the second aspect of the invention is shown. Here also optional steps are included. In a first step 200, a measuring signal is acquired. In a second step 201, an amplitude histogram of the measuring signal is determined. In a third step 202, an initial triggering condition is determined based upon the amplitude histogram. In a fourth step 203, at least one condition of the measuring signal is determined based on the initial triggering condition determined in the third step 202. In a fifth step 204, data words comprising changes of the at least one condition and the respective time of occurrence are stored. In a sixth step 205, at least one parameter is determined from the data words. In a seventh step 206, a parameter histogram is determined based upon the determined at least one parameter. In an eighth step 207, a trigger type and trigger parameters are determined. This is done based upon the parameter histogram determined in the seventh step 206. In a ninth step 208, a triggering is performed based upon the determined trigger type and trigger parameters. In a final tenth step 209, a measurement is performed based upon the triggering. In addition, optionally, the amplitude histogram and/or the parameter histogram and/or measuring results can be displayed on a display device.

The invention is not limited to the examples and especially not to the specific trigger types or parameters shown above. The invention discussed above can be applied to any triggering type and can be employed in a wide variety of measuring device, which employ triggering. The characteristics of the exemplary embodiments can be used in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measuring device with automated trigger function, comprising:
   a processor;
   an interface, configured to acquire a measuring signal,
   a triggering unit, configured to, upon execution by the processor, determine at least one condition of the measuring signal based on an initial triggering condition,
   a non-transitory computer-readable storage medium, configured to upon execution by the processor, store data words, comprising changes of the at least one condition of the measuring signal, and instants in time at which the changes of the at least one condition occur,
   a parameter determination unit, configured to, upon execution by the processor, determine at least one parameter from the data words,
   a parameter histogram unit, configured to upon execution by the processor, determine:
      a parameter histogram of the at least one parameter, and
      a separate parameter histogram for each parameter of the at least one parameter that allows selection of at least one peak of one or more peaks in order for the triggering unit to perform the triggering on a section of the measuring signal corresponding to a selected peak.

2. The measuring device according to claim 1,
   wherein the measuring device further comprises a trigger determining unit, configured to, upon execution by the processor, determine a trigger type and trigger parameters based upon the parameter histogram.

3. The measuring device according to claim 2,
wherein the triggering unit is further configured to perform a triggering of the measuring signal based upon the trigger type and trigger parameters determined by the trigger determining unit.

4. The measuring device according to claim 3,
wherein the measuring device further comprises a measuring unit, configured to, upon execution by the processor, measure the measuring signal based upon the triggering performed by the triggering unit.

5. The measuring device according to claim 1,
wherein the measuring device further comprises a display device configured to, upon execution by the processor, display the parameter histogram.

6. The measuring device according to claim 1,
wherein the measuring device comprises a further interface, configured to, upon execution by the processor, receive a further measuring signal, and
wherein the measuring device is further configured to, upon execution by the processor, process the further measuring signal as the measuring signal.

7. The measuring device according to claim 1,
wherein the measuring device further comprises a clock signal interface, configured to, upon execution by the processor, receive a clock signal.

8. The measuring device according to claim 1,
wherein the at least one parameter is an interval length, or a cycle length, or a glitch time, or a rise time, or a fall time, or a setup and hold time.

9. The measuring device according to claim 1,
wherein the parameter histogram unit is further configured to determine the parameter histogram based on a signal amplitude or based on a time condition.

10. The measuring device according to claim 1,
wherein the measuring device comprises an amplitude histogram unit, configured to, upon execution by the processor, determine an amplitude histogram of the measuring signal.

11. The measuring device according to claim 10,
wherein the amplitude histogram unit is further configured to determine the initial triggering condition from the amplitude histogram.

12. The measuring device according to claim 11,
wherein the amplitude histogram unit is configured to determine the initial triggering condition as a comparison of an amplitude of the measuring signal to at least one threshold, wherein the at least one threshold is an upper threshold or a lower threshold.

13. An oscilloscope being or comprising a measuring device according to claim 1.

14. A method, comprising:
acquiring a measuring signal,
determining at least one condition of the measuring signal based on an initial triggering condition,
storing data words, comprising changes of the at least one condition of the measuring signal, and instants in time at which the changes of the at least one condition occur,
determining at least one parameter from the data words,
determining a parameter histogram of the at least one parameter, and
determining a separate parameter histogram for each parameter of the at least one parameter that allows selection of at least one peak in order to perform the triggering on a section of the measuring signal corresponding to a selected peak.

* * * * *